US007700054B2

(12) United States Patent
Hayashida et al.

(10) Patent No.: US 7,700,054 B2
(45) Date of Patent: Apr. 20, 2010

(54) SUBSTRATE PROCESSING APPARATUS HAVING GAS SIDE FLOW VIA GAS INLET

(75) Inventors: Akira Hayashida, Toyama (JP); Masaaki Ueno, Toyama (JP); Masakazu Shimada, Toyama (JP); Yukinori Aburatani, Toyama (JP); Tomoyuki Yamada, Toyama (JP); Seiyo Nakashima, Toyama (JP); Masashi Sugishita, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 34 days.

(21) Appl. No.: 11/987,493

(22) Filed: Nov. 30, 2007

(65) Prior Publication Data

US 2008/0153314 A1 Jun. 26, 2008

(30) Foreign Application Priority Data

Dec. 12, 2006 (JP) ............................ 2006-334997
Nov. 22, 2007 (JP) ............................ 2007-303488

(51) Int. Cl.
*H01L 21/00* (2006.01)
*B01J 19/00* (2006.01)
*F27B 5/14* (2006.01)

(52) U.S. Cl. ............... 422/202; 432/209; 257/E21.001; 118/715

(58) Field of Classification Search ................. 438/795; 422/202; 432/209; 257/E21.001; 118/715
See application file for complete search history.

(56) References Cited

U.S. PATENT DOCUMENTS

2003/0164143 A1 * 9/2003 Toyoda et al. ............ 118/723 E
2003/0183614 A1 * 10/2003 Yamaguchi et al. ......... 219/390

FOREIGN PATENT DOCUMENTS

| | | | |
|---|---|---|---|
| JP | A-2000-068214 | | 3/2000 |
| JP | A 2003-017422 | | 1/2003 |
| JP | A 2003-158083 | | 5/2003 |
| JP | 2006-24806 | * | 1/2006 |
| JP | 2006-203033 | * | 8/2006 |
| JP | 2006-319175 | * | 11/2006 |
| KR | B1-0147353 | | 11/1998 |

* cited by examiner

*Primary Examiner*—Matthew Smith
*Assistant Examiner*—Walter H Swanson
(74) *Attorney, Agent, or Firm*—Oliff & Berridge, PLC

(57) ABSTRACT

An object of the present invention is to improve substrate processing efficiency. A substrate processing apparatus has a reaction tube that processes a substrate inside, and a heating apparatus disposed so as to surround an external periphery of the reaction tube, so that at least a gas inlet tube is disposed on a side surface in an area in which the substrate is processed inside the reaction tube, and the heating apparatus has a heat insulator that surrounds the reaction tube, an inlet opening formed in the shape of a groove in the heat insulator from the lower end of the heating apparatus so as to avoid the gas inlet tube, and a heating element disposed between the heat insulator and the reaction tube.

12 Claims, 10 Drawing Sheets

FIG. 8
CONVENTIONAL
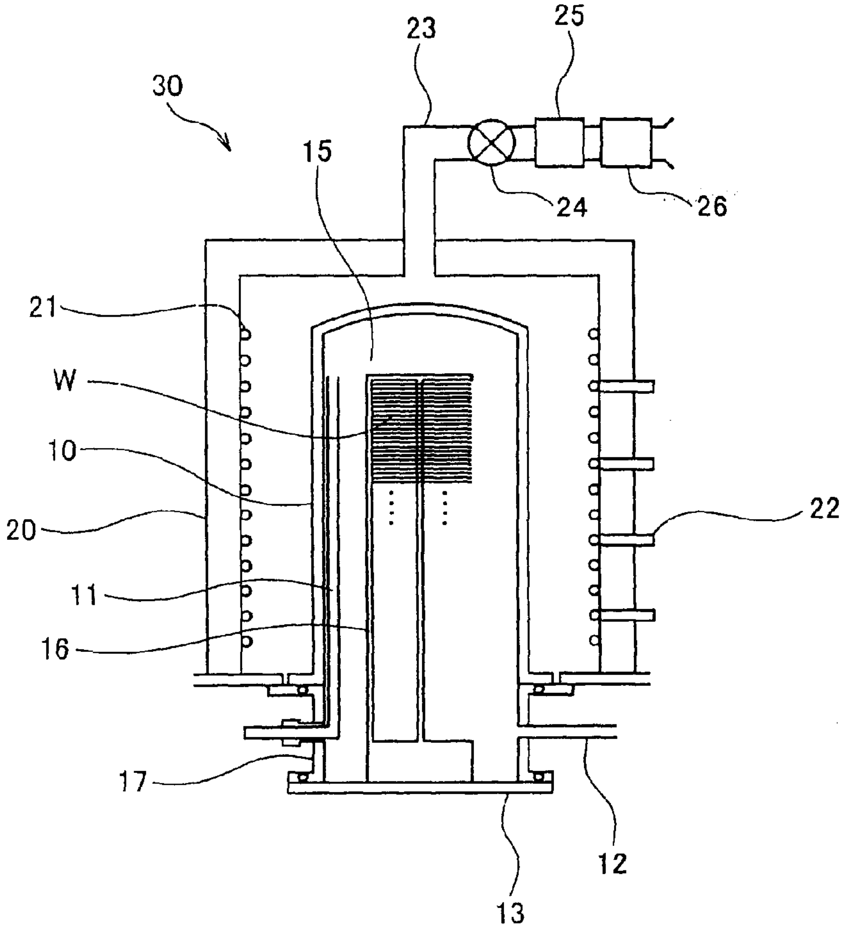

SUBSTRATE PROCESSING APPARATUS HAVING GAS SIDE FLOW VIA GAS INLET

BACKGROUND OF THE INVENTION

1. Field of the Invention

The present invention relates to a substrate processing apparatus, a method of manufacturing a semiconductor device, and a heating apparatus, and particularly relates to an apparatus that is suitable for a configuration in which the gas flow is a side flow.

2. Description of the Related Art

FIG. 8 shows a schematic view of a processing furnace 30 that uses a conventional reaction tube 10 and a heater 20 that constitute a substrate processing apparatus.

The reaction tube 10 and heater 20 have a cylindrical shape having a cover at the top end. A boat 16 for holding wafers W on numerous shelves in the vertical direction is disposed in the reaction tube 10. The reaction tube 10 has a gas nozzle 11 that stands erect from the lower end and that supplies processing gas inside the tube. An exhaust tube 12 for evacuating gas from inside the reaction tube 10 is disposed at the lower end of the reaction tube 10.

In the diagram, reference numeral 17 is a manifold that supports the reaction tube 10, 13 is a seal cap that closes off the opening the manifold 17, 21 is a heater element wire, 22 is a temperature sensor for controlling the heater, 23 is a duct for evacuating the space between the heater 20 and the reaction tube 10, 24 is a valve disposed in the duct 23, 25 is a radiator, and 26 is a blower.

In a conventional processing furnace such as the one described above, there is a problem in that the wafer processing efficiency is poor because a majority of the processing gas fed from the gas nozzle 11 passes through the area at the periphery of the wafers W, where conductance is poor, and is evacuated rather than being passed between the wafers W.

In view of this situation, a configuration has been proposed (e.g., JP-A 2000-68214) in which the flow of processing gas improved by configuring the gas nozzle 11 as a multi-system nozzle and feeding processing gas from the multi-system nozzle into the reaction tube during the film formation process.

However, there is a problem that the substrate processing efficiency remains poor because the gas inlet tube still stands erect from the lower end, despite forming the gas inlet tube into a multi-system gas inlet tube.

An object of the present invention is to provide a substrate processing apparatus, a method of manufacturing a semiconductor device, and a heating apparatus that solve the problems of the above-described prior art and that can improve substrate processing efficiency.

SUMMARY OF THE INVENTION

In accordance with a first aspect of the present invention, a substrate processing apparatus is provided that comprises a reaction tube that processes a substrate inside, and a heating apparatus disposed so as to surround an external periphery of the reaction tube, so that at least a gas inlet tube is disposed on a side surface in an area in which the substrate is processed inside the reaction tube, and the heating apparatus has a heat insulator that surrounds the reaction tube, an inlet opening formed in the shape of a groove in the heat insulator from the lower end of the heating apparatus so as to avoid the gas inlet tube, and a heating element disposed between the heat insulator and the reaction tube.

BRIEF DESCRIPTION OF THE DRAWINGS

FIG. 8 is a schematic view of a processing furnace in which a conventional reaction tube and heater are used;

DESCRIPTION OF THE PREFERRED EMBODIMENTS OF THE INVENTION

Figure 1:
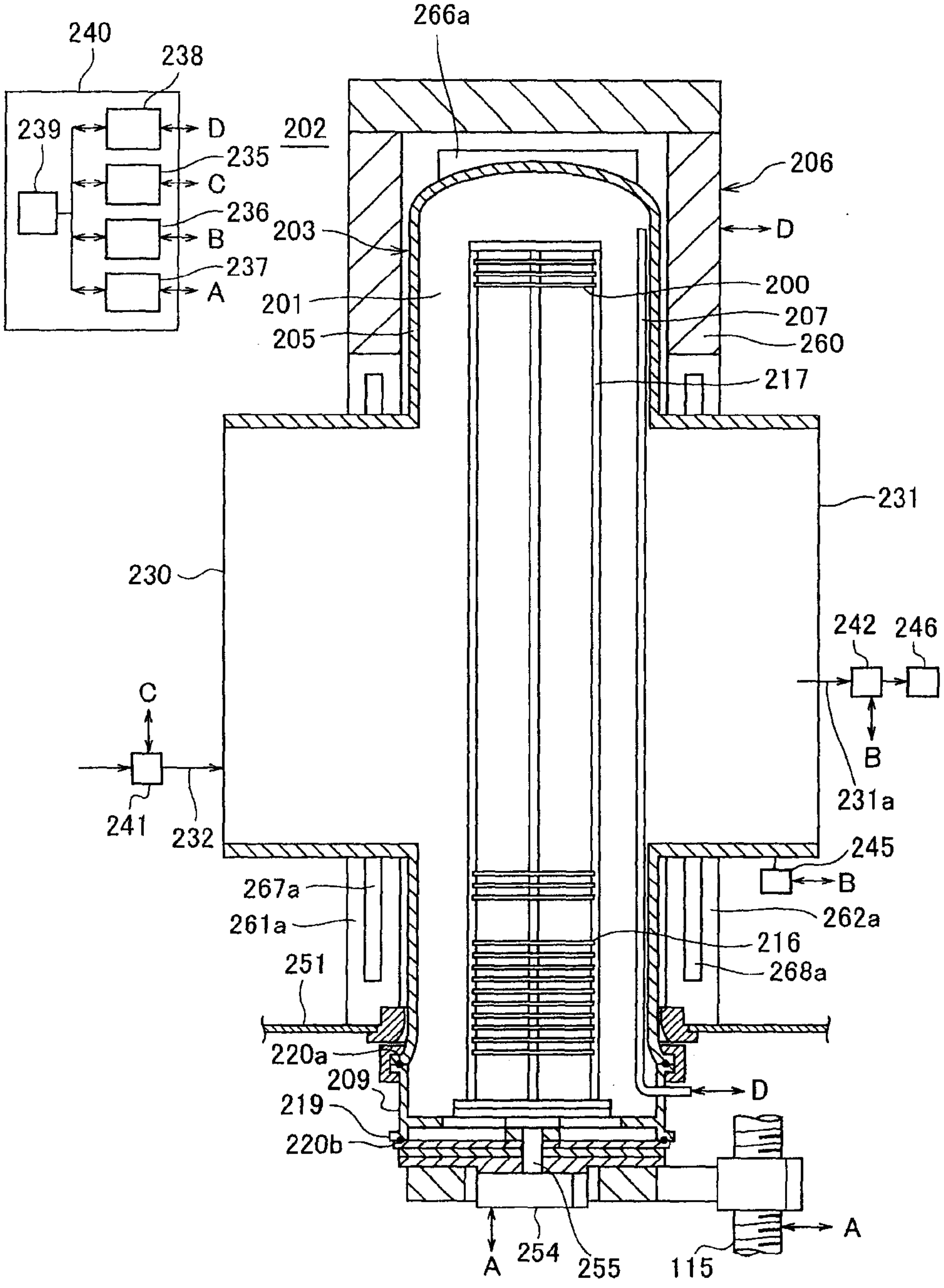
FIG. 1 is a schematic view of the processing furnace of the substrate processing apparatus in an embodiment of the present invention.

In accordance with the present invention, substrate processing efficiency can be improved.

In accordance with the first aspect of the present invention, a substrate processing apparatus is provided that comprises a reaction tube that processes a substrate inside, and a heating apparatus disposed so as to surround an external periphery of the reaction tube, so that at least a gas inlet tube is disposed on a side surface in an area in which the substrate is processed inside the reaction tube, and the heating apparatus has a heat insulator that surrounds the reaction tube, an inlet opening formed in the shape of a groove in the heat insulator from the lower end of the heating apparatus so as to avoid the gas inlet tube, and a heating element disposed between the heat insulator and the reaction tube.

A substrate can be effectively heated via the reaction tube because a heating element is disposed between the reaction tube and the heat insulator of the heating apparatus. When a gas inlet tube is disposed on a side surface in the area in which the substrate is processed inside the reaction tube, the gas flow supplied from the gas inlet tube into the reaction tube is a side flow, and the substrates are processed when [gas] passes over the heated substrates. The efficiency of substrate processing can therefore be improved.

There is a problem in that the gas inlet tube may interfere with the heating apparatus that surrounds the exterior of the reaction tube when the gas inlet tube is disposed on the side surface of the reaction tube, but since the inlet opening is formed in the heat insulator constituting the heating apparatus so as to avoid the gas inlet tube, the problem of interference is eliminated. Also, the mounting and demounting of the reaction tube on heating apparatus can be facilitated when the inlet opening is formed in the shape of a groove from the lower end of the heating apparatus, and it is possible to reduce the heat that escapes from the inside of the heating apparatus to the outside.

In accordance with a second aspect of the present invention, a substrate processing apparatus is provided that comprises a cylindrical reaction tube that processes a substrate inside, and a cylindrical heating apparatus disposed so as to surround the exterior of the reaction tube, so that at least a gas inlet tube is disposed on a side surface in an area in which the substrate is processed inside the reaction tube, and the heating apparatus has a cylindrical heat insulator, an inlet opening formed in the shape of a groove in the heat insulator from the lower end of the heating apparatus so as to avoid the gas inlet tube, and a heating element disposed between the heat insulator and the reaction tube.

In accordance with the second aspect, the reaction tube and the heating apparatus are cylindrically shaped. Therefore, in addition to the effect of the first aspect, the configuration has excellent uniform heating, and the substrate processing efficiency can be further improved.

The inlet opening is preferably formed over the entire side area positioned in the substrate processing area. The substrate processing area is preferably a substrate product processing area. Also, a second heat insulating material that is separate from the heat insulating material, or a heater that is separate from the heating element is preferably disposed on the lower end side away from an area in which the gas inlet tube is disposed.

The substrate processing area can be covered with a side flow when the inlet opening is formed over the entire side area positioned in the substrate processing area. Also, the substrate product processing area can be covered with a side flow when the substrate processing area is the substrate product processing area. Therefore, the substrate processing efficiency can be further improved. Also, heat can be effectively prevented from escaping from the outlet opening when a second heat insulating material that is separate from the heat insulating material is disposed on the lower end side of the heating apparatus away from an area in which the gas inlet tube is disposed. Gas introduced from the gas inlet tube can be preheated when a heater that is separate from the heating element is disposed on the lower end side of the heating apparatus away from an area in which the gas inlet tube is disposed. The substrate processing efficiency can therefore be further improved.

In accordance with a third aspect of the present invention, a substrate processing apparatus is provided that comprises a reaction tube that processes a substrate inside, and a heating apparatus disposed so as to surround an external periphery of the reaction tube, so that at least a gas inlet tube is disposed on a side surface in an area in which the substrate is processed inside the reaction tube, and the heating apparatus has a heat insulator that surrounds the reaction tube, an inlet opening formed in the shape of a groove in the heat insulator from the lower end of the heating apparatus so as to avoid the gas inlet tube, a first heating element disposed between the heat insulator and the reaction tube, and a second heating element disposed between the outlet opening and the gas inlet tube.

Substrates are heated via the reaction tube because a first heating element is disposed between the reaction tube and the heat insulator of the heating apparatus. When gas is introduced inside the reaction tube from the gas inlet tube disposed on the side surface in an area in which the substrates are processed inside the reaction tube, the gas flow is a side flow, and substrates are processed when [the gas] flows over the heated substrates. Therefore, the substrate processing efficiency can be improved.

A problem readily occurs in which heat escapes through the outlet opening and a cold spot is created during substrate processing when the inlet opening is formed in the heat insulator of the heating apparatus. However, the amount of heat that escapes through the outlet opening to the exterior can be supplemented and the generation of a cold spot in the outlet opening can be prevented because a second heating element is disposed between the outlet opening and the gas inlet tube. Also, gas introduced from the gas inlet tube is heated in the outlet opening and is then supplied inside the reaction tube. Substrate processing efficiency can therefore be improved.

When a gas inlet tube is provided to the side surface of the reaction tube, a problem may occur in which the gas inlet tube interferes with the heating apparatus that covers the external periphery of the reaction tube. However, such a problem is eliminated because the inlet opening is formed in the heat insulator constituting the heating apparatus so as to avoid the gas inlet tube. Since the inlet opening is formed in the shape of a groove from the lower end of the heating apparatus, the mounting and demounting of the reaction tube from the heating apparatus is facilitated, and it is possible to reduce the amount of heat dissipated from the inlet opening.

In accordance with the fourth embodiment of the present invention, a substrate processing apparatus is provided that comprises a cylindrical reaction tube that processes a substrate inside, and a cylindrical heating apparatus disposed so as to surround the exterior of the reaction tube, so that at least a gas inlet tube is disposed on a side surface in an area in which the substrate is processed inside the reaction tube, and the heating apparatus has a cylindrical heat insulator, an inlet opening formed in the shape of a groove in the heat insulator from the lower end of the heating apparatus so as to avoid the gas inlet tube, and a first heating element disposed between the heat insulator and the reaction tube, and a second heating element disposed between the outlet opening and the gas inlet tube.

In accordance with the fourth aspect the reaction tube and the heating apparatus are cylindrically shaped. Therefore, in addition to the effect of the third aspect, the configuration has excellent uniform heating, and the substrate processing efficiency can be further improved.

There is provided a method of manufacturing a semiconductor that processes a substrate by using the substrate processing apparatus according to the first aspect of the present invention, the method comprising: loading a substrate to an inside of the reaction tube; heating the inside of the reaction tube by the heating element while introducing gas from the gas inlet tube to the inside of the reaction tube, and processing the substrate; and unloading the substrate from the inside of the reaction tube. In accordance therewith, substrate heating efficiency can be improved.

There is provided a method of manufacturing a semiconductor device that processes a substrate by using the substrate processing apparatus according to the second aspect of the present invention, the method comprising: loading a substrate into the substrate product processing area of an inside of the reaction tube; heating the inside of the reaction tube by the heating element while introducing gas from the gas inlet tube to the inside of the reaction tube, and processing the substrate; and unloading the substrate from the inside of the reaction tube. In accordance therewith, substrate heating efficiency can be improved.

Preferably, the first heating element and the second heating element are each connected to separate heat sources. When the first heating element and the second heating element are each connected to separate heat sources, each can be independently controlled. For this reason, control that conforms to the gas flow state inside of the gas inlet tube and the reaction tube is made possible. In addition, the processing gas can be sufficiently preheated to a temperature at which a reaction can occur and substrate processing can be efficiently carried out In addition, a plurality of the second heating elements is preferably disposed in parallel from the gas upstream side to the gas downstream side of the gas inlet tube. The gas can thereby be more precisely heated.

Preferably, a gas exhaust tube is further provided to the side surface in the area in which substrates are processed inside the reaction tube; and the heating apparatus furthermore has an outlet opening disposed in a heat insulator so as to avoid the gas exhaust tube, and a third heating element disposed between the outlet and the gas exhaust tube.

Substrate processing efficiency can be further improved because a side flow is produced not only for gas introduction but also for exhaust when gas is evacuated from inside the reaction tube through the gas exhaust tube provided to the side surface of the reaction tube.

When the outlet formed so as to avoid the gas exhaust tube is formed in the heat insulating material of the heating apparatus, a problem readily occurs in that heat escapes from the outlet and a cold spot is created during substrate processing. However, the amount of heat that escapes from the outlet to the exterior can be supplemented and the generation of a cold spot at the outlet can be prevented because a third heat source is disposed between the outlet and the gas exhaust tube. Also, byproducts can be prevented from depositing in the gas exhaust tube because the gas exhaust tube is heated at the outlet.

In addition, a plurality of the third heating elements is preferably disposed in parallel from the gas upstream side to the gas downstream side of the gas exhaust tube. The gas can thereby be more precisely heated.

Preferably, the first heating element and the third heating element are each connected to separate heat sources. When the first heating element and the third heating element are each connected to separate heat sources, each can be independently controlled. For this reason, control that conforms to the gas flow state inside of the gas exhaust tube is made possible. Also, byproduct deposits in the gas exhaust tube can be effectively prevented.

Preferably, the second heating element increases heating speed in comparison with the first heating element. Substrate processing efficiency can be further improved because the processing gas can be rapidly preheated to a temperature at which a reaction can occur when the second heating element is provided with a higher heating speed in comparison with the first heating element.

Preferably, the second heating element is a lamp heater, and the first heating element is a resistance heater. The second heating element can be made to heat more rapidly than the first heating element when the second heating element is a lamp heater and the first heating element is a resistance heater.

There is provided a method of manufacturing a semiconductor device that processes a substrate by using the substrate processing apparatus according to the third aspect of the present invention, the method comprising loading a substrate to an inside of the reaction tube; introducing gas from the gas inlet tube into the reaction tube, heating the gas inside the gas inlet tube by the second heating element, heating the inside of the reaction tube by the first heating element, and processing the substrate; and unloading the substrate from the inside of the reaction tube.

Substrate processing efficiency can thereby be improved.

There is provided a method of manufacturing a semiconductor device that processes a substrate by using the substrate processing apparatus according to the fourth aspect of the present invention, the method comprising: loading a substrate to an inside of the reaction tube; introducing gas from the gas inlet tube into the reaction tube; heating the gas inside the gas inlet tube by the second heating element; heating the inside of the reaction tube by the first heating element; and processing the substrate while heating the gas in the gas exhaust tube by using the third heating element; and unloading the substrate from the inside of the reaction tube. Substrate processing efficiency can thereby be improved.

In accordance with the fifth aspect of the present invention, there is provided a heating apparatus that is used in a semiconductor manufacturing apparatus, the heating apparatus comprising a cylindrical heat insulator; a heating element disposed along the inside wall of the cylindrical portion of the heat insulator, and an inlet opening formed in the shape of a groove in at least the heat insulator from the lower end of the heating apparatus so as to avoid the gas inlet tube on a side surface in an area that has the heating element.

When such a heating apparatus is used, the reaction tube can be easily mounted or demounted from the heating apparatus, the amount of radiant heat from the inlet opening can be reduced, and the reaction tube can be easily heated. The substrate processing efficiency can thereby be improved.

The present invention is effective for use in a substrate processing apparatus related to substrate processing technology, and more particularly to heat processing technology for processing substrates that have been loaded into a reaction tube and heated by a heating apparatus. Examples of such a substrate processing apparatus include those that are used for oxidation processing and diffusion processing of semiconductor wafers in which semiconductor integrated circuit devices (semiconductor devices) are made, those that are used in reflowing and annealing for smoothing and carrier activation after ion injection, and those that are used for film formation by thermal CVD reaction. Among the substrate processing apparatuses described above, the present invention is also effective in a heating apparatus of a substrate processing apparatus in which a reaction tube capable of producing a side flow (reaction tube with a side flow) is used.

Embodiments of the present invention will be described hereinafter with reference to the drawings.

<Configuration of a Side-flow Reaction Tube>

Figure 2:
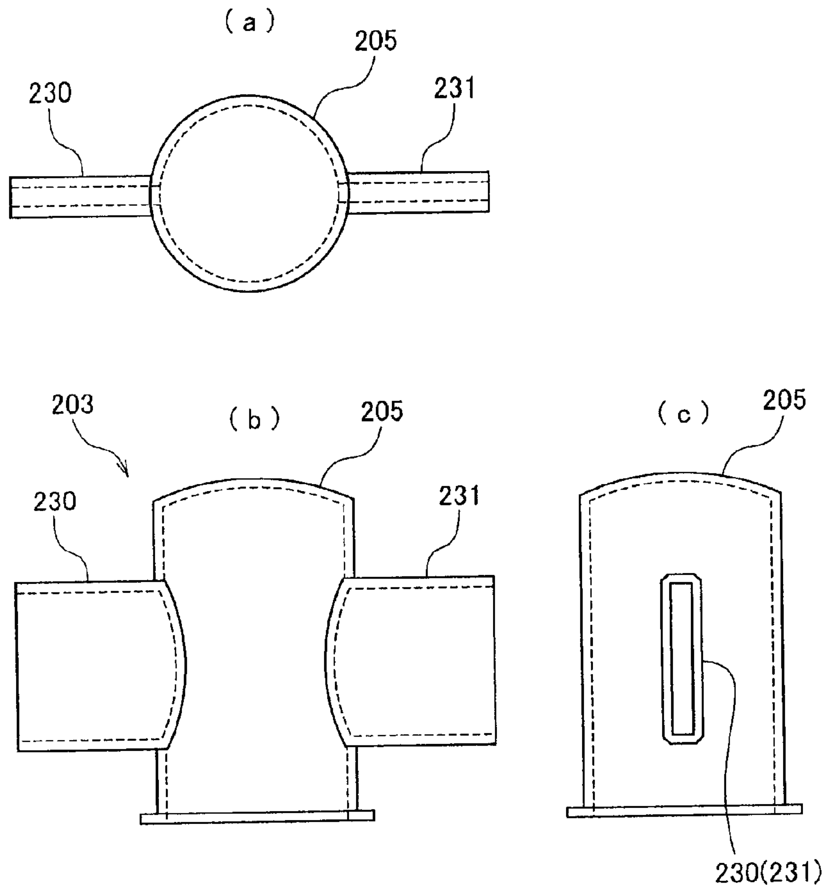
FIG. 2 is a schematic view of the side-flow reaction tube in an embodiment of the present invention.

FIG. 2 is a schematic view showing a side flow reaction 203. FIG. 2A is a plan view, FIG. 2B is a front view, and FIG. 2C is a side view that is the same as viewed from the left or the right.

The reaction tube 203 is composed of, e.g., quartz ($SiO_2$), silicon carbide (SiC), or another heat-resistant glass material, a body 205, a gas inlet tube 230 that introduces gas inside the body 205, and a gas exhaust tube 231 that evacuates the inside of the body 205. The body 205 is a vertical body and is a cylindrical shape in which the upper end is closed off and the lower end is open.

The cross-sectional shapes of the gas inlet tube 230 and gas exhaust tube 231 may be any shape and are, e.g., flat rectangular parallelepiped shapes having a hollow interior. The gas inlet tube 230 and gas exhaust tube 231 are symmetrically disposed having the flat surface facing the horizontal direction on the side surface of the vertically erect body 205. The side surface position of the body 205 on which the gas inlet tube 230 and gas exhaust tube 231 are disposed is the center position of the side surface of the body 205 and the intermediate position in the height direction, and is a position that faces all or a part of a single wafer or a plurality of wafers 200 that is to be processed inside the body 205. The gas inlet tube 230 and gas exhaust tube 231 are horizontally connected to the body 205. The gas inlet tube 230 and gas exhaust tube 231 are connected by welding to the body 205 so that the axes of the tubes are aligned on a straight line.

The area in which the wafers are processed inside the body 205 of the reaction tube 203 is referred to as the substrate processing area.

<Gas Flow Inside the Reaction Container>

Figure 3:
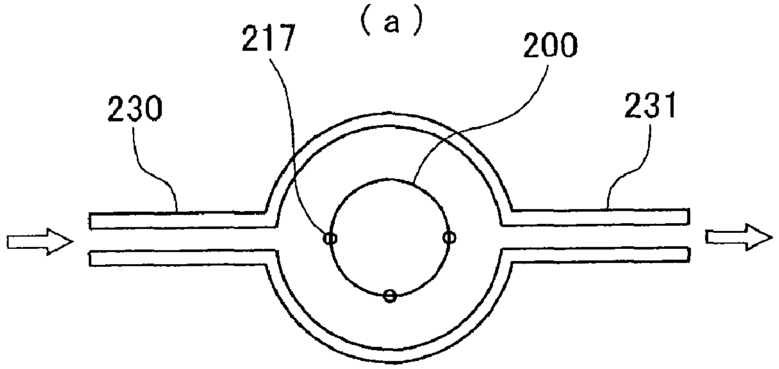
FIG. 3 is a schematic view of a reaction container in which the side-flow reaction tube in an embodiment of the present invention is used.
Figure 3:
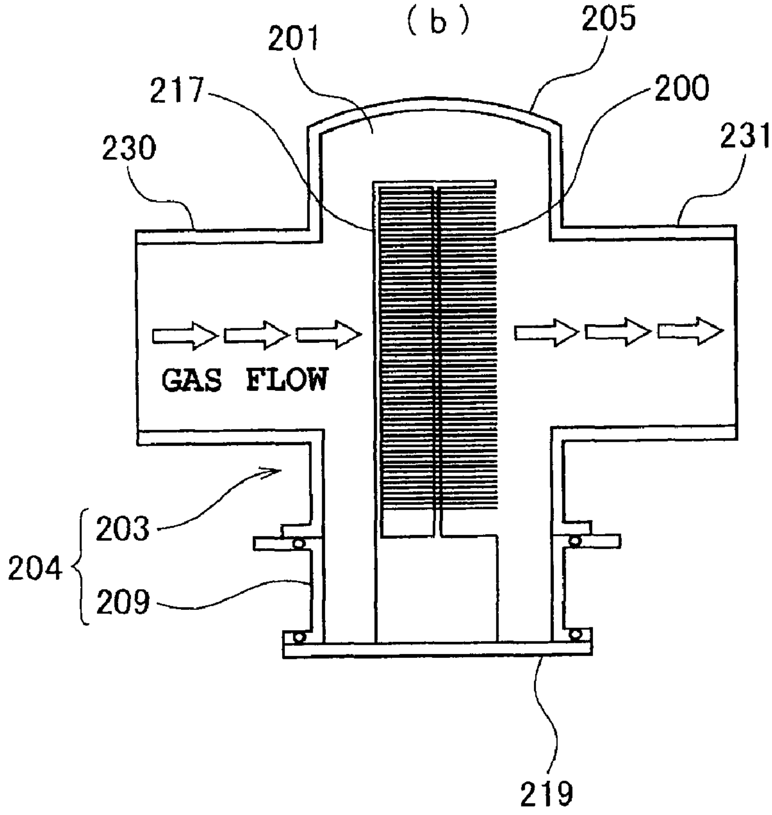

FIG. 3 is a schematic view showing a reaction container 204 in which a side-flow reaction tube 203 is used, and also showing a boat 217 loaded inside the reaction container 204. FIG. 3A is a plan view, and FIG. 3B is a front cross-sectional view.

The reaction container 204 is composed of a reaction tube 203 and a manifold 209. The manifold 209 is cylindrically formed having open upper and lower ends. The manifold 209 is connected to the lower end of the reaction tube 203 and is disposed so as to support the reaction tube 203. A processing chamber 201 for processing wafers 200 is formed inside the reaction container 204.

A boat 217 as a substrate holder that holds the wafers 200 on a plurality of shelves in the vertical direction is inserted into the processing chamber 201. The lower end opening of the manifold 209 is closed off in an airtight manner by a seal cap 219 that supports the boat 217 inserted inside the processing chamber 201.

Processing gas introduced from the gas inlet tube 230 of the reaction tube 203 is evacuated from the gas exhaust tube 231, whereby the flow of gas inside the processing chamber 201 is made into a side flow in the manner indicated by the white arrow. The processing gas is thereby smoothly supplied between the wafers 200 because the processing gas can be supplied to the wafers 200 from the horizontal direction and evacuated from the horizontal direction as well.

<Heater Configuration>

Figure 4:
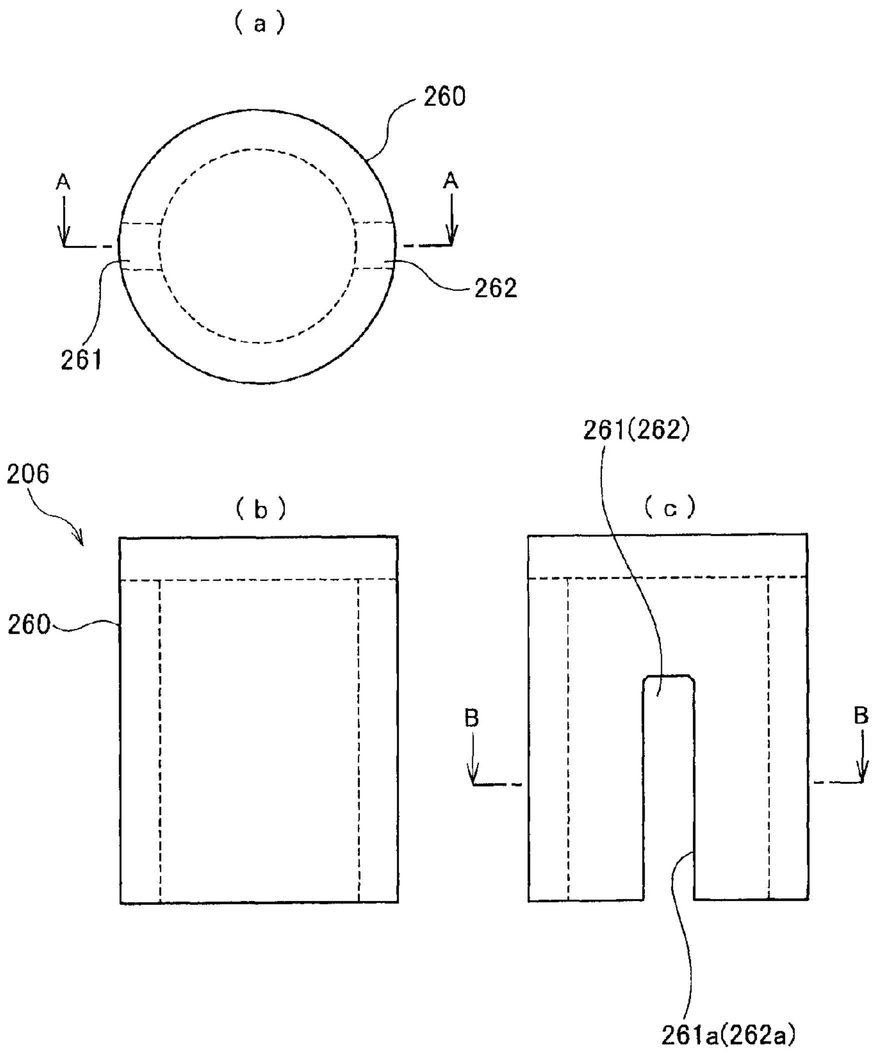
FIG. 4 is a schematic view of a heater that heats a wafer inside the side-flow reaction tube in an embodiment of the present invention.

FIG. 4 is a schematic view of a heater 206 acting as the heating apparatus that heats the wafers 200 inside the reaction tube 203. FIG. 4A is a plan view, FIG. 4B is a front view, and FIG. 4C is a side view that is the same as viewed from the left or the right.

The heater 206 has a cylindrical heat insulator 260 that has a closed top section and an open bottom section, an outlet opening 261 that is formed so that contact is not made and interference does not occur with the gas inlet tube 230 of the heat insulator 260, and an outlet 262 that is formed in the heat insulator 260 on the opposite side from the outlet opening 261 so as to avoid the gas exhaust tube 231. The outlet opening 261 and outlet 262 formed in the heat insulator 260 so as to avoid the gas inlet tube 230 and gas exhaust tube 231 are formed over the entire side area of the heat insulator 260 positioned in the substrate processing area. As used herein, the substrate processing area refers to a substrate processing area in which side dummy substrates that are mounted on the top and bottom ends of the boat 217 and substrate products are processed, and to a substrate product processing area in which only substrate products are processed.

Specifically, the outlet opening 261 formed in the heat insulator 260 so as to avoid the gas inlet tube 230 is provided in a rectilinear manner, e.g., from the lower end of the heat insulator 260 of the gas inlet tube 230 to a position slightly above the center, and is formed as a groove-shaped notched portion 261a that is used for the gas inlet tube and is wider than the thickness of the flat rectangular parallelepiped shape of the gas inlet tube 230. Also, the outlet 262 formed in the heat insulator 260 so as to avoid the gas exhaust tube 231 is provided in a rectilinear manner, e.g., from the lower end of the heat insulator 260 in same manner as the outlet opening 261 to a position slightly above the center, and is formed as a groove-shaped notched portion *262a* for the gas exhaust tube that is wider than the thickness of the flat rectangular parallelepiped shape of the gas exhaust tube 231. When the heater 206 is set over the reaction tube 203 from above the reaction tube 203, the interference between the gas inlet tube 230 shaped as a flat rectangular parallelepiped and the gas exhaust tube 231 can be avoided and the heater 206 can be set over the external periphery of the reaction tube 203.

The width of the notched portion *261a* for the gas inlet tube is preferably less than the diameter of the reaction tube, and is more preferably less than the diameter of the wafer 200 processed inside of the reaction tube.

The width of the gas inlet tube 230 is preferably set so that the width in the horizontal direction in relation to the substrate processing surface is ½ or less with respect to the diameter of the substrate. This is because with this setting, gas that flows out from the gas inlet tube 230 can be made to flow all the way to the center of the substrate without a reduction in the flow rate. The width is more preferably set so that the width in the horizontal direction in relation to the substrate processing surface is ⅓ or less with respect to the diameter of the substrate. This is because with this setting, gas that flows out from the gas inlet tube 230 can be made to flow all the way to the center of the substrate without a reduction in the flow rate. The width is even more preferably set so that the width in the horizontal direction in relation to the substrate processing surface is 1/15 or less with respect to the diameter of the substrate. This is because with this setting, gas that flows out from the gas inlet tube 230 can be made to flow all the way to the center of the substrate without a reduction in the flow rate. The width of the notched portion *261a* for the gas inlet tube may be determined in accordance with these width settings for the gas inlet tube 230. The width is preferably one that does not have negative thermal effect on the exterior, even if heat is emitted from between the notched portion *261a* for the gas inlet tube and the gas inlet tube 230.

The width of the notched portion *262a* for the gas exhaust tube is preferably less than the diameter of the reaction tube, and is more preferably less than the diameter of the wafer 200 processed inside of the reaction tube.

The width of the gas exhaust tube 231 is preferably set so that the width in the horizontal direction in relation to the substrate processing surface is ½ or less with respect to the diameter of the substrate. This is because with this setting, gas brought out from the gas inlet tube 230 can be made to pass through the center of the substrate and flow to the gas exhaust tube 231 without a reduction in the flow rate. The width in the horizontal direction in relation to the substrate processing surface is more preferably ⅓ or less with respect to the diameter of the substrate. This is because with this setting, gas brought out from the gas inlet tube 230 can be made to pass through the center of the substrate and flow to the gas exhaust tube 231 without a reduction in the flow rate. The width in the horizontal direction in relation to the substrate processing surface is even more preferably 1/15 or less with respect to the diameter of the substrate. This is because with this setting, gas brought out from the gas inlet tube 230 can be made to pass through the center of the substrate and flow to the gas exhaust tube 231 without a reduction in the flow rate. The width of the notched portion 262*a* for the gas exhaust tube may be determined in accordance with these width settings for the gas exhaust tube 231. The width is preferably one that does not have negative thermal effect on the exterior, even if heat is emitted from between the notched portion 262*a* for the gas exhaust tube and the gas exhaust tube 231.

<Internal Structure of the Heater>

Figure 5:
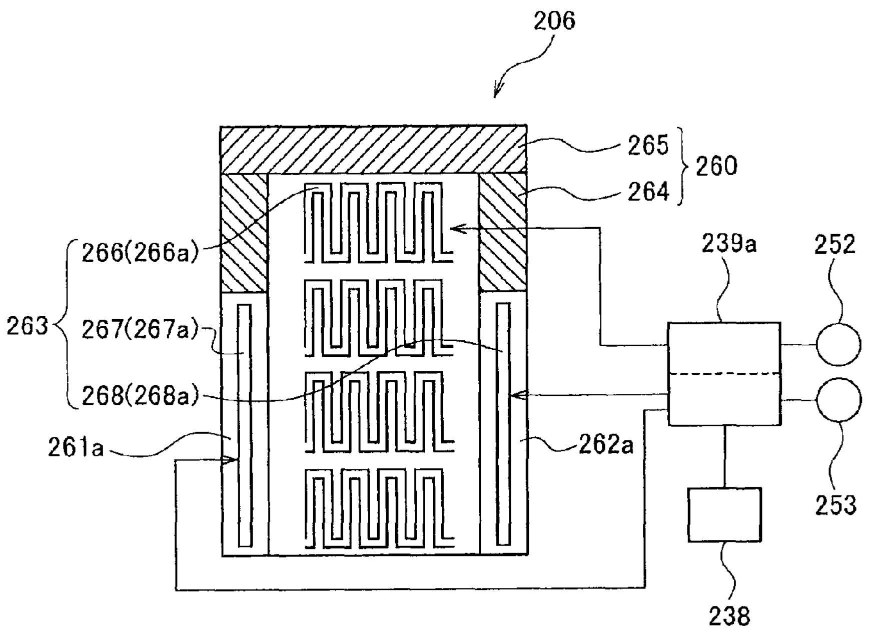
FIG. 5 is a view of the cross section A-A of the heater shown in FIG. 4 in an embodiment of the present invention.
Figure 6:
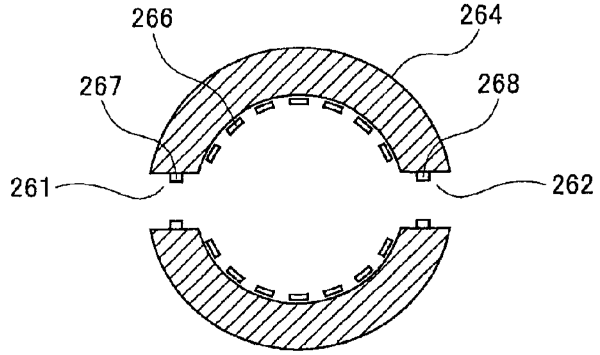
FIG. 6 is a view of the cross section B-B of the heater shown in FIG. 4 in an embodiment of the present invention.

FIGS. 5 and 6 are cross-sectional views of the heater 206. FIG. 5 is a view of the cross section along the line A-A of FIG. 4A, and FIG. 6 is a view of the cross section along the line B-B of FIG. 4C.

The heat insulator 260 of the heater 206 is composed of a cylindrical sidewall heat insulating material 264, and a circular ceiling heat insulating material 265 that closes the upper portion of the sidewall heat insulating material 264.

A heating element 263 is provided to the heat insulator 260. The heating element 263 is composed of a first heating element 266 that heats the reaction tube 203, a second heating element 267 that heats the gas inlet tube 230, and a third heating element 268 that heats the gas exhaust tube 231.

A heater element wire 266*a* acting as the first heating element 266 is disposed between the sidewall heat insulating material 264 and the reaction tube 203. The heater element wire 266*a* is formed in a zigzag shape in the vertical direction and is annularly disposed along the inside wall of the sidewall heat insulating material 264 in each zone obtained by dividing the structure into zones (four zones in the diagrammed example) in the vertical direction in a conventional manner.

A sidewall heat source 267*a* that is used for the gas inlet tube and acts as the second heating element 267 is disposed between the gas inlet tube 230 and the notched portion 261*a* for the gas inlet tube. The sidewall heat source 267*a* for the gas inlet tube is disposed along the inside wall of the notched portion 261*a* for the gas inlet tube.

A sidewall heat source 268*a* that is used for the gas exhaust tube and acts as the third heating element 268 is disposed between the gas exhaust tube 231 and the notched portion 262*a* for the gas exhaust tube. The sidewall heat source 268*a* for the gas exhaust tube is disposed along the inside wall of the notched portion 262*a* for the gas exhaust tube.

The sidewall heat source 267*a* for the gas inlet tube and the sidewall heat source 268*a* for the gas exhaust tube are disposed so as to be tightly laid out on the inside wall of the notched sections in the vicinity of at least the gas inlet tube 230 or the gas exhaust tube 231. These heat sources are preferably disposed not only on a sidewall of the notched portion 261*a* for the gas inlet tube or the notched portion 262*a* for the gas exhaust tube, but also on the opposing inside walls; and [the heat sources] are more preferably also disposed on the upper inside wall of the notched portion 261*a* for the gas inlet tube or the notched portion 262*a* for the gas exhaust tube. In such a configuration, the sidewall heat source 267*a* for the gas inlet tube, and the sidewall heat source 268*a* for the gas exhaust tube are disposed astride divided zones of the heater element wire 266*a*. A power source 253 that supplies power to the sidewall heat source 267*a* for the gas inlet tube and to the sidewall heat source 268*a* for the gas exhaust tube via a power control circuit 239*a* is a different power source than the power source 252 that supplies power to the heater element wire 266*a*. The reference numeral 238 is a temperature controller.

The width of the notched portion 262*a* for the gas exhaust tube is preferably in a range that substantially allows the sidewall heat source 267*a* for the gas inlet tube to heat the gas inlet tube 230. The width is even more preferably one in which the notched portion 261*a* for the gas inlet tube and the gas inlet tube 230 do not make physical in contact even when the sidewall heat source 267*a* for the gas inlet tube is disposed between the notched portion 261*a* for the gas inlet tube and the gas inlet tube 230.

The width of the notched portion 262*a* for the gas exhaust tube is preferably in a range that substantially allows the sidewall heat source 268*a* for a gas exhaust tube to heat the gas exhaust tube 231. The width is even more preferably one in which the notched portion 262*a* for the gas exhaust tube and the gas exhaust tube 231 do not make physical in contact even when the sidewall heat source 268*a* for the gas exhaust tube is disposed between the notched portion 262*a* for the gas exhaust tube and the gas exhaust tube 231.

Preferably, the sidewall heat source 267*a* for the gas inlet tube and the sidewall heat source 268*a* for the gas exhaust tube are disposed all the way downward from the lowest end of the gas inlet tube 230. The lowest end portion, which cools better than the intermediate portion of the gas inlet tube 230, can thereby be provided with a larger number of heat lines in comparison with the intermediate area of the gas inlet tube 230. Preferably, the sidewall heat source 267*a* for the gas inlet tube and/or the sidewall heat source 268*a* for the gas exhaust tube are disposed all the way upward from the topmost end of the gas inlet tube 230. The topmost end portion, which cools better than the intermediate portion of the gas inlet tube 230, can thereby be provided with numerous heat lines.

Preferably, more precise temperature control is possible when the sidewall heat source 267*a* for the gas inlet tube and/or the sidewall heat source 268*a* for the gas exhaust tube are divided into zones in the same manner as the zone divisions of the heater element wire 266*a*.

The zones are preferably divided at the same height as the zone divisions of the heater wire 266*a*. It is thereby possible to reduce the difficulty in mutual control brought about by the thermal interference between the sidewall heat source 267*a* for the gas inlet tube and/or the sidewall heat source 268*a* for the gas exhaust tube and the heater wire 266*a*.

<Configuration of the Processing Furnace>

Figure 7:
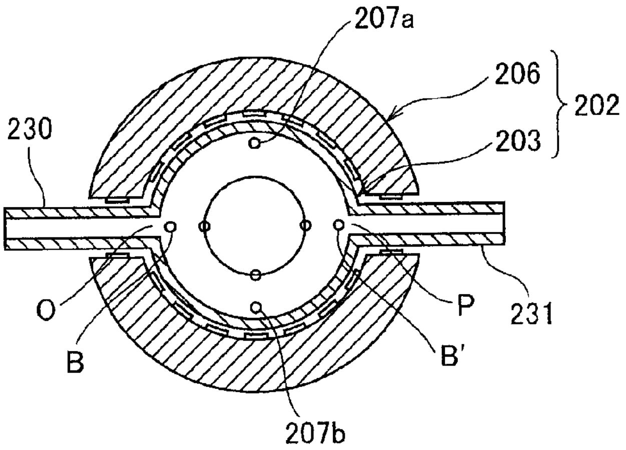
FIG. 7 is a cross-sectional view of a reaction furnace in which the side-flow reaction tube has been incorporated into the heater in an embodiment of the present invention.
Figure 7:
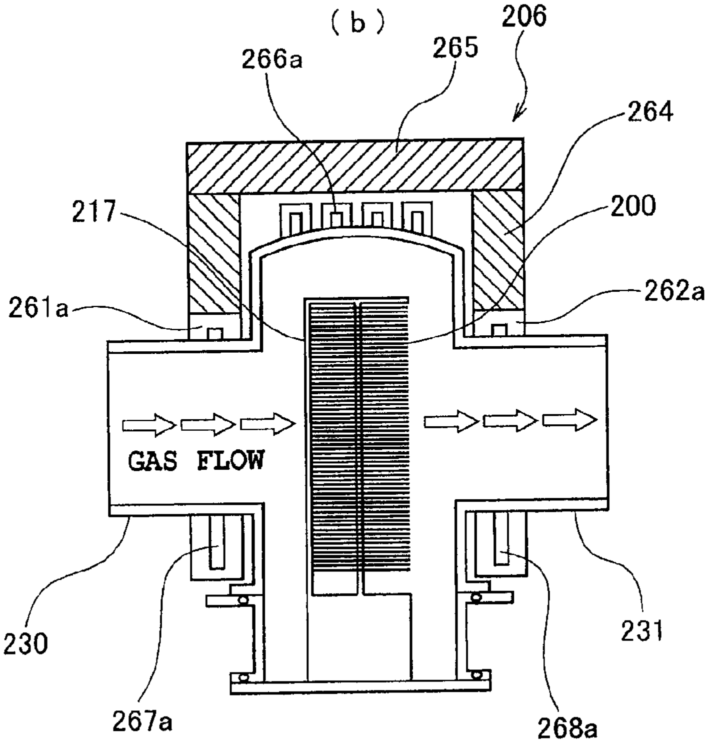

FIG. 7 shows a processing furnace 202 having a configuration in which the side-flow reaction tube 203 has been incorporated in the heater 206 described above. FIG. 7A is a lateral cross-sectional view, and FIG. 7B is a longitudinal sectional view. The sidewall heat source 267*a* for the gas inlet tube and the sidewall heat source 268*a* for the gas exhaust tube are disposed in the vicinity of the gas inlet tube 230 and gas exhaust tube 231, respectively, and the sidewall heat source 267*a* for the gas inlet tube and the sidewall heat source 268*a* for the gas exhaust tube are controlled by a different power source than that of the heater element wire 266*a*. Therefore, the same amount of heat as the heat released to the exterior from the notched portion 261*a* for the gas inlet tube and the notched portion 262*a* for the gas exhaust tube can be imparted to the gas inlet tube 230 and the gas exhaust tube 231.

<Method of Manufacturing a Semiconductor Device by the Substrate Processing Apparatus>

The substrate processing apparatus of an embodiment of the present invention as described above has a cylindrical reaction tube 203 that processes a substrate inside, and a cylindrical heater 206 that is disposed so as to surround the external periphery of the reaction tube 203. A gas inlet tube 230 and a gas exhaust tube 231 are disposed on the side surfaces in the area in which wafers 200 are processed inside the reaction tube 203. The heater 206 has a cylindrical heat insulator 260, an outlet opening 261 that is formed in the shape of a groove in the heat insulator 260 so as to avoid the gas inlet tube 230 from the lower end of the heater 206, a first heating element 266 disposed between the heat insulator 260 and the reaction tube 203, a second heating element 267 disposed between the outlet opening 261 and the gas inlet tube 230, and a third heating element 268 disposed between the outlet 262 and the gas exhaust tube 231.

Manufacturing a semiconductor device by the substrate processing apparatus entails loading the wafers 200 inside the reaction tube 203, introducing gas from the gas inlet tube 230 into the reaction tube 203, and evacuating the gas from the gas exhaust tube 231. In this case, the gas inside the gas inlet tube 230 is heated by the second heating element 267, and the gas exhaust tube 231 is heated by the third heating element 268. The inside of the reaction tube 203 is heated by the first heating element 266, and the wafers 200 are processed. After processing, the wafers 200 are unloaded from inside the reaction tube 203.

<Effect of the Embodiment>

In accordance with the present embodiment as described above, one or more of the following effects are obtained.

(1) The gas inlet tube 230 and gas exhaust tube 231 are disposed on the two sides of the reaction tube 203, whereby substrate processing efficiency can be improved because the gas flow is a side flow when gas is introduced through the gas inlet tube 230 into the reaction tube 203 while being evacuated through the gas exhaust tube 231.

(2) A problem readily occurs in which heat escapes through the notched portion 261*a* for the gas inlet tube, and a cold spot is created during substrate processing when the notched portion 261*a* for the gas inlet tube is formed in the heat insulator 260 of the heater 206 so as to avoid the gas inlet tube 230. However, the amount of heat that escapes to the exterior through the notched portion 261*a* for the gas inlet tube can be supplemented and the generation of a cold spot in the notched portion 261*a* for the gas inlet tube can be prevented even when a notched portion 261*a* for the gas inlet tube 230 is present in the heater 206, because a sidewall heat source 267*a* for the gas inlet tube is disposed between the gas inlet tube 230 and the notched portion 261*a* for the gas inlet tube. Also, a problem readily occurs in which heat escapes through the notched portion 262*a* for the gas exhaust tube, and a cold spot is created during substrate processing when the notched portion 262*a* for the gas exhaust tube is formed in the heat insulator 260 of the heater 206 so as to avoid the gas exhaust tube 231. However, the amount of heat that escapes to the exterior through the notched portion 262*a* for the gas exhaust tube can be supplemented and the generation of a cold spot in the notched portion 262*a* for the gas exhaust tube can be prevented even when a notched portion 262*a* for the gas exhaust tube 231 is present in the heater 206, because a sidewall heat source 268*a* for the gas exhaust tube is disposed between the gas exhaust tube 231 and the notched portion 262*a* for the gas exhaust tube. Substrate processing efficiency can therefore be improved.

(3) A sidewall heat source 267*a* for the gas inlet tube is provided, whereby the processing gas can be sufficiently preheated to a temperature at which a reaction can occur and substrate processing can be efficiently carried out because the gas inlet tube 230 is heated by the sidewall heat source 267*a* for the gas inlet tube. Also, liquefaction in the gas inlet tube 230 can be prevented in the case that a liquid raw material or a raw material that readily liquefies at normal temperature and normal pressure is used as the source gas.

(4) A sidewall heat source 268*a* for the gas exhaust tube is provided. Byproducts can therefore be prevented from depositing in the gas exhaust tube 231 because the gas exhaust tube 231 is heated by the sidewall heat source 268*a* for the gas exhaust tube.

<Other Embodiments>

An embodiment of the present invention was described in detail above, but the present invention is not limited to the embodiment described above.

For example, in the case that a gas nozzle or the like is erected from the lower end inside the heater and gas is supplied inside the reaction tube, a problem readily occurs in that the gas is heated inside the gas nozzle, and the temperature of the gas varies depending on the height of the gas nozzle or the position of the plurality of wafers stacked in the substrate processing area inside the reaction tube. However, in the present embodiment, notched portions are formed across the entire side area of the heater positioned in the substrate processing area inside the reaction tube, and the axes of the gas inlet tube and the gas exhaust tube that are inserted into the notched portions are disposed horizontally relative to the wafers. For this reason, the temperature of the processing gas can be made uniform among the plurality of wafer surfaces undergoing batch processing. In the present embodiment, the gas inlet tube and gas exhaust tube of the reaction tube are horizontally connected the side surface of the vertical body and are long in the lateral direction in the manner of extended vanes. Therefore, the flow of gas can be made laminar and uniform in a single direction. Also, since the amount of gas introduced between the wafers is uniform, a gas in which the concentration and velocity are uniform can be sent to the wafers, and the uniformity of the thickness of the film can be improved among and within wafers.

Also, in the embodiment described above, an example was described wherein a side-flow reaction tube 203 in which a gas inlet tube 230 and gas exhaust tube 231 are disposed in the body 205, but the present invention is not limited thereby, and a configuration in which the side-flow reaction tube is provided with a single tube, i.e., a gas inlet tube or a gas exhaust tube, is also possible. In such a case, the gas exhaust tube may be disposed on the manifold 209 (e.g., see FIG. 8) that supports the reaction tube 203 when only the gas inlet tube is provided to the reaction tube 203, and the gas inlet tube may be disposed on the manifold 209 that supports the reaction tube 203 when only the gas exhaust tube 231 is provided to the reaction tube 203 (e.g., see FIG. 8).

In the embodiment described above, mention was not made of the type of heating element 263, but as long as the power sources 252 and 253 that supply power to the heater element wire 266*a*, the sidewall heat source 267*a* for the gas inlet tube, and the sidewall heat source 268*a* for the gas exhaust tube are separate power sources, the same type of heat source may be used for the heater element wire 266*a*, the sidewall heat source 267*a* for the gas inlet tube, and the sidewall heat source 268*a* for the gas exhaust tube. In this case, the heat source is preferably, e.g., a resistance heat source, a lamp heat source, or an induction heating coil. The heat sources may also be different types of heat sources. In particular it is preferable to use a resistance heat source, e.g., a wire composed of molybdenum disilicide ($MoSi_2$), which is capable of high-speed heating and cooling, as the heat source in the case of the heater element wire 266*a*, and to use a lamp heat source that is capable of even higher speed heating and cooling, e.g., an infrared lamp, because the sidewall heat source 267*a* for the gas inlet tube and the sidewall heat source 268*a* for the gas exhaust tube are readily affected by heat from the outside and readily radiate heat.

Also, in the present embodiment, the power source that supplies power to the heater element wire 266*a*, the sidewall heat source 267*a* for the gas inlet tube, and the sidewall heat source 268*a* for the gas exhaust tube are separate power sources, but the power sources are not required to be separate, for example, and the power control circuit 239*a* may be a separate circuit. The power control circuits of the second heating element and the third heating element are preferably provided separate from each other, and the second heating element and the third heating are independently controlled.

The heat sources of the present invention are composed of the power source and power control circuit described above.

In the embodiment of a reaction furnace described above, a configuration was described in which two notched portions are provided to the two facing side surfaces of the heater, the gas inlet tube and the gas exhaust tube of the reaction tube are inserted into the notched portions, nothing is disposed below the inserted gas inlet tube and gas exhaust tube, and the notched portions are left open. However, in another embodiment of the present invention, a second heat insulator that is separate from the heat insulator, or a heat source (hereinafter referred to as a "separate heat insulator or the like") that is separate from the second heat insulator and the first heat source may be provided to the lower end side of the heat away from the area in which the inserted gas inlet tube or gas exhaust tube is inserted in position. In this case, the separate heat insulator or the like can be made detachable so as to avoid interference with the insertion of the gas inlet tube or the gas exhaust tube into the notched portion.

Another embodiment of the reaction furnace in which a separate heat insulating material or the like such as that described above is provided to a heater will be described with reference to FIGS. 9 to 12.

Figure 9:
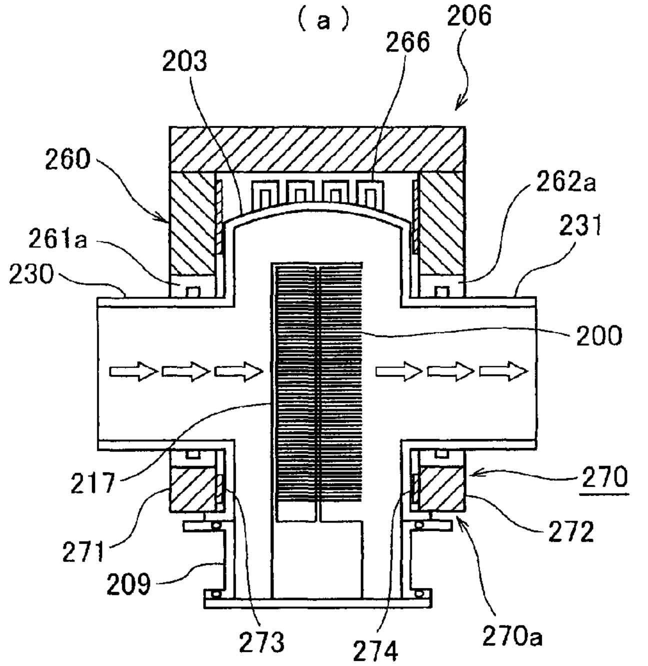
FIG. 9 is a longitudinal view of the reaction furnace in another embodiment of the present invention and is a view in which a side-flow type reaction tube is incorporated into the heater and a separate insulation material or the like is thereafter disposed in the heater.
Figure 9:
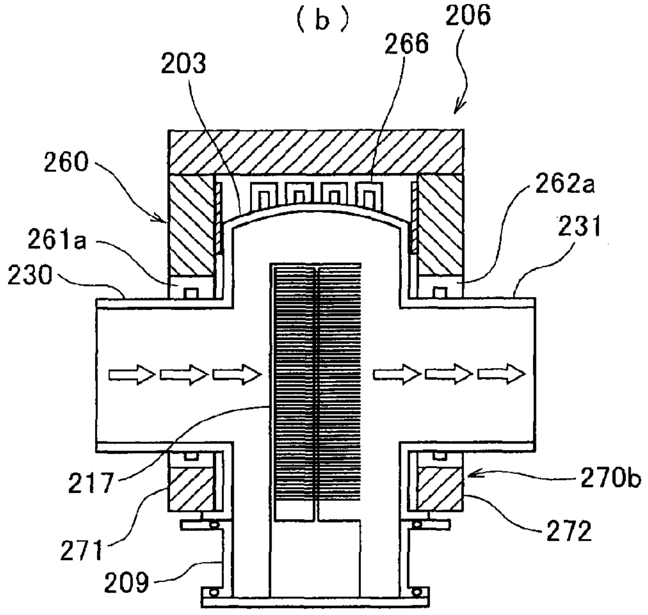

FIG. 9 is a longitudinal sectional view of a reaction furnace in which a side-flow reaction tube is incorporated inside a heater, and a separate heat insulating material or the like is thereafter provided to the heater. FIG. 9A is a view in which a second heat insulating material and a separate heating element have been provided, and FIG. 9B is a view in which only a second heat insulating material has been provided.

A second heat insulating material 270 that is separate from the heat insulator 260 is disposed toward the lower end of the heater 206 away from the area in which the gas inlet tube 230 and gas exhaust tube 231 are inserted, which are the notched portion 261*a* for the gas inlet tube and the notched portion 262*a* for the gas exhaust tube on the two facing side surfaces of the heater 206, as shown in FIG. 9A. The second heat insulating material 270 is composed of a heat insulating material 271 for the inlet-side notched portion that closes off the lower end side of the notched portion 261*a* for the gas inlet tube, and a heat insulating material 272 for the exhaust-side notched portion that closes off the lower end side of the notched portion 262*a* for the gas exhaust tube. A fourth heating element 273 and a fifth heating element 274 that are separate from the first heating element 266 are provided to the heat insulating material 271 for the inlet-side notched portion and the heat insulating material 272 for the exhaust-side notched portion, respectively. A heater element wire 273a for the inlet-side heat insulating material as a fourth heating element 273 is disposed along the inside wall that faces the reaction tube 203 of the heat insulating material 271 for the inlet-side notched portion. A heater element wire 274*a* for the exhaust-side heat insulating material as a fifth heating element 274 is disposed along the inside wall that faces the reaction tube 203 of the heat insulating material 272 for the exhaust-side notched portion. As used herein, the heat insulating material 271 that is used for the inlet-side notched portion and has the heater element wire 273*a* for the inlet-side heat insulating material, and the heat insulating material 272 that is used for the exhaust-side notched portion and has the heater element wire 274*a* for the exhaust-side heat insulating material are referred to as "heater-equipped heat insulating materials 270*a*."

In order to dispose the heater-equipped heat insulating materials 270*a* in the notched portion, the reaction tube 203 is mounted inside the heater 206, and the gas inlet tube 230 and gas exhaust tube 231 are inserted into the notched portion 261*a* for the gas inlet tube and the notched portion 262*a* for the gas exhaust tube, respectively. The heater-equipped heat insulating materials 270*a* are mounted in the notched portion 261*a* for the gas inlet tube and the notched portion 262*a* for the gas exhaust tube below the gas inlet tube 230 and the second heat insulating material 270. A fitting method such as one in which, e.g., one part is made convex and the other is made concave, may be adopted so that the heater-equipped heat insulating materials 270*a* are detachably mounted.

The reaction furnace shown in FIG. 9B differs from the reaction furnace in FIG. 9A is that the heater element wire 273*a* for the inlet-side heat insulating material and the heater element wire 274*a* for the exhaust-side heat insulating material are not provided to the heat insulating material 271 for the inlet-side notched portion and the heat insulating material 272 for the exhaust-side notched portion. In contrast to the heater-equipped heat insulating materials 270*a*, heat insulating materials that do not have these heater element wires is referred to as heater-less heat insulating materials 270*b*.

Figure 10:
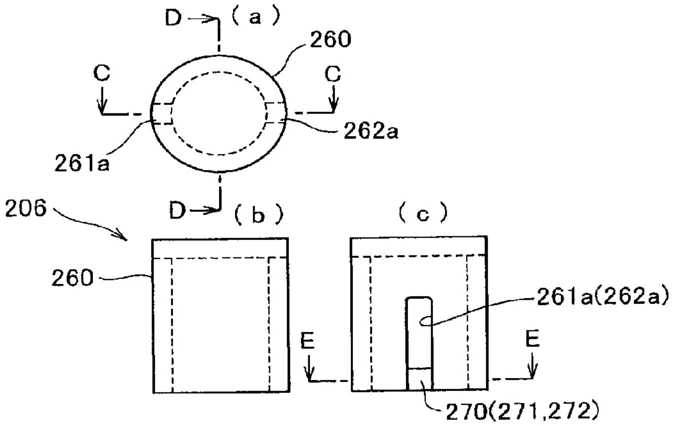
FIG. 10 is a schematic view of a heater in another embodiment of the present invention and a view in which a separate insulation material or the like is disposed.

FIG. 10 is a schematic view of a heater in which separate heat insulating materials are provided. The heater 206 shown in FIG. 10 has the same basic configuration as the configuration of the heater schematically shown in FIG. 4 described above. The heater shown in FIG. 10 differs from the heater of FIG. 4 in that the second heat insulating material 270 is newly provided, a cross-sectional view along the line D-D is added, the cross-sectional view along the line B-B is modified to be the cross-sectional view along the line E-E, and the reference symbol of the cross-sectional view C-C replaces the reference symbol of the cross-sectional view A-A.

Figure 11:
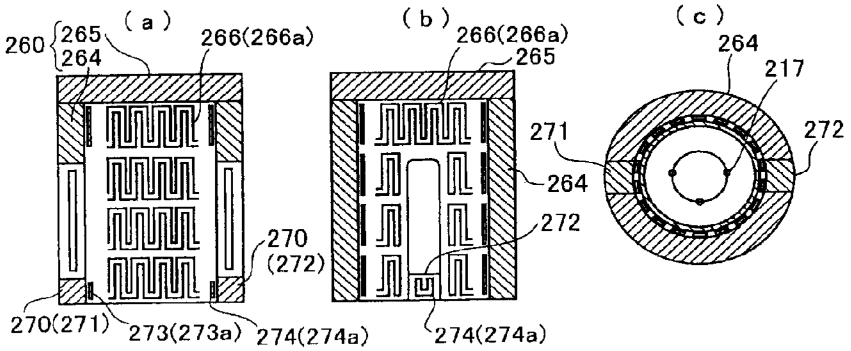
FIG. 11 is a cross-sectional view along the arrows shown in FIG. 10 and is a view that shows a heater in which a second heat insulation material and a separate heating element are disposed.

FIG. 11 is a cross-sectional view of FIG. 10 and shows a heater provided with a second heat insulating material and a separate heat source. FIG. 11A is a cross-sectional view along the line C-C of FIG. 10; FIG. 11B is a cross-sectional view along the line D-D of FIG. 10; and FIG. 11C is a cross-sectional view along the line E-E of FIG. 10. As made apparent in the diagram, the heat insulating material 271 for the inlet-side notched portion and the heat insulating material 272 for the exhaust-side notched portion, wherein the elements are designed to close off the lower part of the notched portion 261*a* for the gas inlet tube and the notched portion 262*a* for the gas exhaust tube formed in the sidewall heat insulating material 264 of the first heat insulator 260, are disposed underneath the respective notches. The heater element wire 273*a* for the inlet-side heat insulating material, as the fourth heating element 273, and the heater element wire 274*a* for the exhaust-side heat insulating material, as the fifth heating element 274, are provided to the heat insulating material 271 for the inlet-side notched portion and the heat insulating material 272 for the exhaust-side notched portion. These elements close off the notched portion 261*a* for the gas inlet tube and the notched portion 262*a* for the gas exhaust tube, respectively. The heater element wire 266*a* as the first heating element 266 is disposed between the sidewall heat insulating material 264 and the reaction tube 203, and, in addition to the first heating element 266, the heater element wires 273*a* and 274*a* as separate heat sources are disposed between the second heat insulating material 270 and the reaction tube 203.

Figure 12:
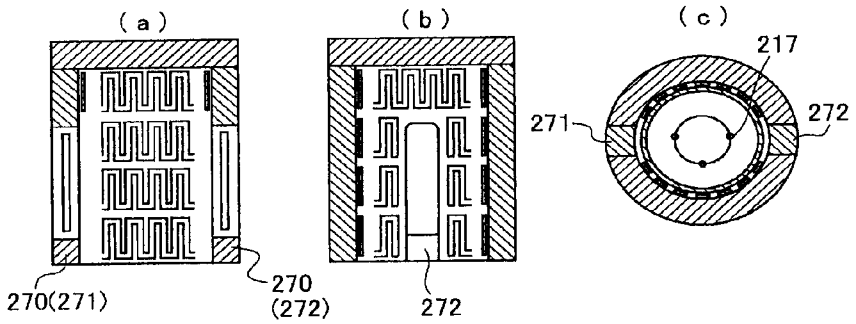
FIG. 12 is a cross-sectional view along the arrows shown in FIG. 10 and is a view that shows a heater in which a heat insulation material without a heater is disposed.

FIG. 12 is a cross-sectional view of FIG. 10 and shows a heater provided with a heater-less heat insulating material 270*b*. The heater shown in FIG. 12 is different from the heater shown in FIG. 11 in that the heater element wire 273*a* for the inlet-side heat insulating material and the heater element wire 274*a* for the exhaust-side heat insulating material are not provided to the heat insulating material 271 for the inlet-side notched portion and the heat insulating material 272 for the exhaust-side notched portion.

In another embodiment, heater-equipped heat insulating materials, or heat insulating materials that do not have a heater are disposed below the gas inlet tube and the gas exhaust tube as described above. The merits of such a configuration are as follows. Specifically, a clearance is required between the reaction tube and the upper and lower ends of the notched portions of the heater to allow for detachment, and heat escapes from such a clearance. However, in the present embodiment, the gas inlet tube and the gas exhaust tube are positioned near the top of the notched portion when the gas inlet tube and gas exhaust tube are inserted, and the heat insulating materials that do not have a heater are disposed in the notched portions below the gas inlet tube and gas exhaust tube, whereby heat can be effectively prevented from escaping from the upper and lower parts of the notched portions of the heater because the upper and lower parts of the notched portions of the heater can be closed off. Furthermore, lost heat can be supplemented by heating from the heater element wire 273*a* (274*a*) when the heat-equipped heat insulating materials are used in place of the heat insulating materials that do not have a heater. In the other embodiment described above, the heater-equipped heat insulating materials or the heat insulating materials that do not have a heater are disposed beneath the gas inlet tube and the gas exhaust tube, but the materials may also be disposed beneath either the gas inlet tube or the gas exhaust tube.

Figure 13:
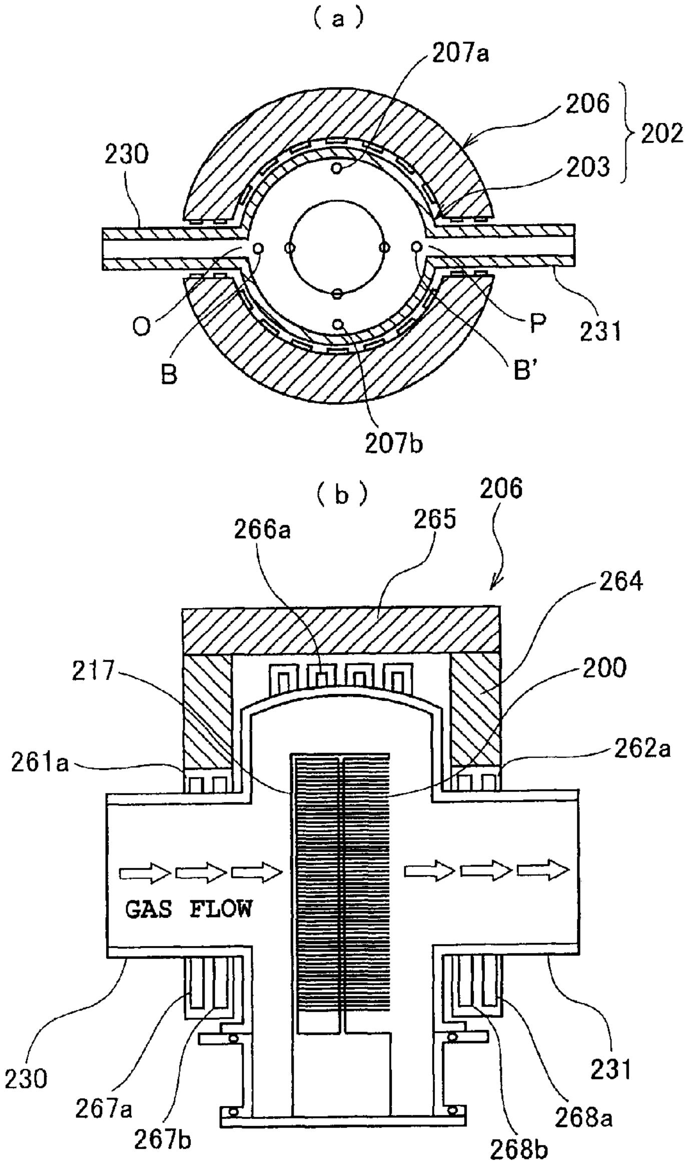
FIG. 13 is a cross-sectional view of the reaction furnace in which a side-flow type reaction tube is incorporated into the heater in another embodiment of the present invention, and is a view in which a plurality of sidewall heat sources for a gas inlet tube are aligned and disposed in parallel.

A plurality of the sidewall heat sources 267*a* for the gas inlet tube is preferably aligned and disposed in parallel on the gas downstream side as far as the gas upstream side of the gas inlet tube 230, as shown in FIG. 13. More preferably, more precise control is possible when each of the plurality of the sidewall heat sources 267*a* for the gas inlet tube is independently controlled.

Even more preferably, more precise control is possible when the sidewall heat source 367*a* for the gas inlet tube is divided into a plurality of zones from the gas upstream side to the gas downstream side of the gas inlet tube 230, and each zone is independently controlled.

It is particularly effective when the heating temperature of the sidewall heat source 267*a* for the gas inlet tube is set to be equal to the temperature of the reaction chamber. This is because when this is done, the gas is sufficiently preheated before arriving at the wafer 200. A seal member having a low heatproof temperature is provided to the connection with the gas inlet line 232 on the upstream side, which is on the opposite side from the side on which the gas inlet tube 230 is connected with the reaction tube 203. For this reason, the temperature on the side of the gas inlet line 232 may be lower than the temperature on the side of the reaction tube 203 among the plurality of the sidewall heat sources 267*a* for the gas inlet tube. The gas of the gas inlet tube 230 can thereby be effectively preheated without causing the seal member to degrade.

A plurality of the sidewall heat sources 268*a* for the gas exhaust tube is preferably aligned and disposed in parallel from the gas upstream side to the gas downstream side of the gas exhaust tube 231, as shown in FIG. 13. More preferably, more precise control is possible when each of the plurality of the sidewall heat sources 268*a* for the gas exhaust tube is independently controlled. Even more preferably, more precise control is possible when the sidewall heat source 368*a* for the gas exhaust tube is divided into a plurality of zones from the gas upstream side to the gas downstream side of the gas exhaust tube 231, and each zone is independently controlled. In particular, with the sidewall heat source 268*a* for the gas exhaust tube, the heating temperature of the gas exhaust tube 231 must be set lower than the temperature of the reaction chamber, but the temperature control of the reaction chamber is negatively affected when the temperature is rapidly reduced. A seal member having a low heatproof temperature is therefore provided to the connection with the gas exhaust line 232*a* on the downstream side, which is on the opposite side from the side on which the gas exhaust tube 231 is connected with the reaction tube 203. For this reason, the temperature on the side of the gas exhaust line 231*a* may be lower than the temperature on the side of the reaction tube 203 among the plurality of the sidewall heat sources 268*a* for the gas exhaust tube. The gas exhaust tube 231 and the gas that flows through the gas exhaust tube 231 can thereby be effectively heated without causing the seal member to degrade.

<Description of a Substrate Processing Apparatus in which the Processing Furnace of the Embodiments is Used>

FIG. 1 is a longitudinal sectional diagram showing a schematic view of the processing furnace 202 of a substrate processing apparatus suitable for use in an embodiment of the present invention.

The processing furnace 202 has a heater 206 as a heating apparatus, as shown in FIG. 1. The heater 206 is cylindrically shaped, is supported on a heater base 251 acting as a holding plate, and is thereby vertically mounted. The heater 206 has a cylindrical heat insulator 260.

A notched portion 261*a* that is used for the gas inlet tube and acts as an inlet opening is formed in the side surface of the heat insulator 260 of the heater 206 so as to avoid the gas inlet tube 230. Also, a notched portion 262*a* that is used for the gas exhaust tube and acts as an outlet is formed so as to avoid the gas exhaust tube 231.

A heater element wire 266*a* acting as a first heat source is disposed between the heater 206 and the reaction tube 203. A sidewall heat source 267*a* that is used for the gas inlet tube and acts as a second heat source is disposed between the gas inlet tube 230 and the notched portion 261*a* for the gas inlet tube. A sidewall heat source 268*a* that is used for the gas exhaust tube and acts as a third heat source is disposed between the gas exhaust tube 231 and the notched portion 262*a* for the gas exhaust tube.

A reaction tube 203 that is concentrically circular with the heater 206 is disposed inside the heater 206. The reaction tube 203 is composed of, e.g., quartz ($SiO_2$), silicon carbide (SiC), or another heat-resistant material, and is cylindrically formed with the upper end closed off and the lower end left open. The reaction tube 203 is configured so that a processing chamber 201 is formed in the hollow portion of the tube, and wafers 200 as substrates can be loaded by a later-described boat 217 in an arrangement of many horizontal shelves stacked in the vertical direction.

A manifold 209 that is concentrically circular with the reaction tube 203 is disposed below the reaction tube 203. The manifold 209 is composed of, e.g., stainless steel or the like, and is formed in a cylindrical shape with open upper and lower ends. The manifold 209 is connected to the reaction tube 203 and is disposed so as to support the reaction tube. An O-ring 220*a* acting as a seal member is disposed between the manifold 209 and the reaction tube 203. The manifold 209 is supported by the heater base 251, whereby the reaction tube 203 can be mounted in a vertical state. The reaction tube 203 and manifold 209 form a reaction container.

The gas inlet tube 230 is connected to the side surface of the reaction tube 203 so as to be in communication with the inside of the processing chamber 201. A gas inlet line 232 is connected via a connection part having a seal member to the upstream side, which is the opposite side of the connection side with the reaction tube 203 of the gas inlet tube 230. A processing gas supply source and an inert gas supply source (not shown) are connected to the gas inlet line 232 via an MFC (Mass Flow Controller) 241 acting as the gas flow rate controller. The upstream side is opposite from the side on which the gas inlet tube 230 is connected with the reaction tube 203. A gas flow rate controller 235 is electrically connected to the MFC 241 and is configured to control the flow rate of supplied gas so as to achieve a prescribed rate with a prescribed timing.

A gas exhaust tube 231 for evacuating the atmosphere inside the processing chamber 201 is disposed on the side opposite from the side on which the gas inlet tube 230 is connected to the side surface of the reaction tube 203. A gas exhaust line 231*a* is connected via a connection part having a seal member to the upstream side, which is the opposite side of the connection side with the reaction tube 203 of the gas exhaust tube 231. A vacuum pump or another evacuation and exhaust apparatus 246 is connected to the gas exhaust line 231 side via a pressure sensor 245 and a pressure adjustment apparatus 242 as a pressure detector. The downstream side opposite from the side on which the gas exhaust tube 231 is connected to the reaction tube 203, and is configured to be capable of evacuating and exhausting the inside of the processing chamber 201 so that the pressure reaches a prescribed pressure (degree of vacuum). A pressure controller 236 is electrically connected to the pressure adjustment apparatus 242 and the pressure sensor 245, and the pressure controller 236 is configured to control the pressure inside the processing chamber 201 by the pressure adjustment apparatus 242 so as to achieve a prescribed pressure with a prescribed timing on the basis of the pressure detected by the pressure sensor 245.

The gas inlet tube 230 and gas exhaust tube 231 disposed in the reaction tube 203 are composed of, e.g., quartz ($SiO_2$), silicon carbide (SiC), or another heat-resistant material in the same manner as the reaction tube 203.

A seal cap 219 acting as a furnace cover capable of closing off the lower end opening of the manifold 209 in an airtight manner is disposed below the manifold 209. The seal cap 219 is brought into contact with the lower end of the manifold 209 from the lower side in the vertical direction. The seal cap 219 is composed of, e.g., stainless steel or another metal, and is formed in the shape of a disc. An O-ring 220*b* is disposed as a seal member on the upper surface of the seal cap 219 and is in contact with the lower end of the manifold 209. A rotation mechanism 254 for rotating the boat is provided to the seal cap 219 on the side opposite from the processing chamber 201. The rotating shaft 255 of the rotation mechanism 254 passes through the seal cap 219, is connected to a later-described boat 217, and is configured so as to rotate the wafers 200 by rotating the boat 217. The seal cap 219 is configured so as to elevate in the vertical direction by using a boat elevator 115 that acts as an elevator mechanism, which is vertically provided to the exterior of the reaction tube 203. The boat 217 can thereby be loaded and unloaded from the processing chamber 201. A drive controller 237 is electrically connected to the rotation mechanism 254 and boat elevator 115, and is configured so as to perform control with a prescribed timing to carry out prescribed operations.

The boat 217 acting as the substrate support device is composed of quartz, silicon carbide, or another heat-resistant material, and is configured so as to hold a plurality of wafers 200 on many shelves in a horizontally-oriented arrangement in which the centers of the wafers are aligned. A plurality of discoid insulation plates 216 that are composed of quartz, silicon carbide, or another heat-resistant material and act as heat insulating materials is disposed on several shelves in the horizontal orientation in the lower part of the boat 217, and is configured so that heat from the heater 206 is less likely to be transmitted to the manifold 209.

Temperature sensors 207*a* and 207*b* as temperature detectors are disposed inside the reaction tube 203 in a respective manner perpendicularly with respect to the flow formed by the gas discharged from the gas inlet tube 230 and caused to flow to the gas exhaust tube 231, and are disposed in opposing positions with the wafers 200 disposed therebetween. A temperature controller 238 is electrically connected to the heater 206 and the temperature sensors 207, and is configured so as to control the temperature inside the processing chamber 201 with prescribed timing so that a prescribed temperature distribution is achieved by adjusting the power flow to the first heat source on the basis of the temperature information detected by the temperature sensor 207.

A temperature sensor B acting as the temperature detector is disposed inside the reaction tube 203. The sensor is positioned between the wafers 200 and a discharge port 0 of the gas inlet tube 230. The temperature controller 238 is electrically connected to the sidewall heat source 267*a* for the gas inlet tube and the temperature sensor B, and is configured so as to control the temperature inside the gas inlet tube 230 with prescribed timing so that a prescribed temperature is achieved by adjusting the power flow to the sidewall heat source 267*a* for the gas inlet tube on the basis of the temperature information detected by the temperature sensor B.

A temperature sensor B' acting as the temperature detector is disposed in the reaction tube 203. The sensor is positioned between the wafers 200 and the exhaust port P of the gas exhaust tube 231. The temperature controller 238 is electrically connected to the sidewall heat source 268*a* for the gas exhaust tube and the temperature sensor B', and is configured so as to control the temperature inside the gas exhaust tube 231 with prescribed timing so that a prescribed temperature is achieved by adjusting the power flow to the sidewall heat source 268*a* for the gas exhaust tube on the basis of the temperature information detected by the temperature sensor B'.

The temperature controller 238 is configured so as to control the described above heater element wire 266*a*, the sidewall heat source 267*a* for the gas inlet tube, and the sidewall heat source 268*a* for the gas exhaust tube by using a separate system for each.

As long as the temperature inside the gas inlet tube 230 and gas exhaust tube 231 can be controlled, the temperature sensors B and B' may be provided to one of the two tubes or to neither of the tubes. Preferably, the sensors are disposed in the position shown in FIG. 7A between the wafers 200 and the discharge port O of the gas inlet tube 230 and between the wafers 200 and the exhaust port P of the gas exhaust tube 231. The sensors are thereby set at a distance from the first to third heat sources. The temperature is controlled on the extended center line between two sidewall heat sources 267*a* for the gas inlet tube in a position where cold spots are readily generated, and on the extended center line between two sidewall heat source 268*a* for the gas exhaust tube in a position closer to the wafers 200 and away from the discharge port O, whereby cold spots can be eliminated, in-plane deviations can be reduced by adequate preheating in the vicinity of the gas inlet tube 230, the temperature in the wall of the exhaust tube can be increased in the vicinity of the gas exhaust tube 231, and byproducts can be prevented from depositing.

The gas flow rate controller 235, pressure controller 236, drive controller 237, and temperature controller 238 also have an operation panel and an I/O unit, and are electrically connected to the a main controller 239 that controls the entire substrate processing apparatus. The gas flow rate controller 235, pressure controller 236, drive controller 237, temperature controller 238, and main controller 239 constitute a controller 240. A power control circuit 239*a* that controls the above-described heating element 263 is disposed inside the main controller 239.

In the embodiment of FIG. 1, the reaction tube 203 is supported by the manifold 209, but as long as the temperature sensor 207 is removed from the seal cap 219 rather than from the manifold 209, the manifold 209 may be omitted. In this case, the reaction tube 203 is supported by the heater base 251. Also, the lower end opening of the reaction tube 203 is closed off in an airtight manner by the seal cap 219, which supports the boat 217.

<Method of Forming a Thin Film using a Processing Furnace>

Next, the method of forming a thin film on the wafers 200 by CVD will be described as one of the steps of manufacturing a semiconductor device using the processing furnace 202 of the above-described configuration. In the description below, the operation of the constituent element of the substrate processing apparatus is controlled by the controller 240.

<Substrate Loading Step>

A plurality of wafers 200 is charged (wafer charge) in the boat 217, whereupon the boat 217 that holds the plurality of wafers 200 is lifted by the boat elevator 115 and loaded (boat loading) into the processing chamber 201, as shown in FIG. 1. In this state, the seal cap 219 has sealed the lower end of the manifold 209 via the O-ring 220*b*.

<Evacuation and Exhaust Step>

The inside of the processing chamber 201 is evacuated and exhausted using the evacuation and exhaust apparatus 246 so that a prescribed a pressure (degree of vacuum) is achieved. In this case, the pressure inside the processing chamber 201 is measured using the pressure sensor 245, and the pressure adjustment apparatus 242 provides feedback control on the basis of the pressure thus measured. Also, the inside of the processing chamber 201 is heated by the first heating element 266 on the basis of the temperature information detected by the temperature sensors 207*a* and 207*b* so as to achieve a prescribed temperature. Also, the inside of the gas inlet tube 230 is heated by the sidewall heat source 267*a* for the gas inlet tube on the basis of temperature information detected by the temperature sensor B so as to achieve a prescribed temperature. At the same time, the gas exhaust tube 231 is heated by the sidewall heat source 268*a* for the gas exhaust tube on the basis of temperature information detected by the temperature sensor B' so as to achieve a prescribed temperature. In this case, the power flow to the heater 206 is controlled via feedback on the basis of the temperature information detected by the temperature sensor 207 so that a prescribed temperature distribution is achieved inside the processing chamber 201. Next, the wafers 200 are rotated when the boat 217 is rotated by the rotation mechanism 254.

<Step of Introducing Gas Inside the Reaction Tube, and Step of Processing Substrates>

Next, gas supplied from the processing gas supply source and controlled by the MFC 241 so that a prescribed flow rate is achieved is introduced from the gas inlet tube 230 into the processing chamber 201. The gas thus introduced is passed through the inside of the processing chamber 201 and is evacuated from the gas exhaust tube 231. The gas makes contact with the surface of the wafers 200 during passage through the inside of the processing chamber 201, and a thin film is deposited (deposition occurs) on the surface of the wafers 200 by thermal CVD reaction.

<Normal Pressure Restoration Step>

When a preset processing time has elapsed, inert gas is supplied from the inert gas supply source, inert gas is substituted inside the processing chamber 201, and the pressure inside the processing chamber 201 is restored to normal pressure.

<Boat Unloading and Wafer Discharge>

The seal cap 219 is then lowered by the boat elevator 115, the lower end of the manifold 209 is opened, and the processed wafers 200 are unloaded (boat unloading) from the lower end of the manifold 209 to the exterior of the reaction tube 203 while held on the boat 217. The processed wafers 200 are thereafter removed from the boat 217 (wafer discharge).

An example of the processing conditions during wafer processing in the processing furnace of the present embodiment is a processing pressure of 10 to 100 Pa, use of dichlorosilane gas (DCS, or $SiH_2Cl_2$) and ammonia gas ($NH_3$) as the types of gases, and gas flow rates of DCS 100 to 300 sccm and $NH_3$ 300 to 1,000 sccm when forming a silicon nitride ($Si_3N_4$) film.

The following temperature can be established, for example: the processing temperature inside the reaction tube 203 heated by the heater element wire 266*a* is set to a temperature of 500° C. to 780° C.; the temperature inside the gas inlet tube 230 heated by the sidewall heat source 267*a* for the gas inlet tube is raised from 150° C. to the processing temperature of 550 to 780° C.; and the processing temperature inside the gas exhaust tube 231 heated by the sidewall heat source 268*a* for the gas exhaust tube is reduced from a temperature of 550 to 780° to a temperature of 150° C.

Wafers are processed by keeping the processing conditions to fixed values within the respective ranges.

<Effect of the Embodiments>

The wafers are heated inside a side-flow reaction tube using a heater 206 structured in the manner described above. Therefore, it is possible to prevent generation of cold spots in the notched portion 261*a* and the notched portion 262*a* for the gas inlet tube 230 and the gas exhaust tube 231 of the heater 206. Wafer processing efficiency can therefore be improved.

What is claimed is:

1. A substrate processing apparatus comprising:

a reaction tube that processes a plurality of substrates inside said reaction tube, said reaction tube having a body that has a substrate processing area processing said plurality of substrates inside said reaction tube, and a gas inlet tube that is disposed at a position facing said plurality of substrates in said substrate processing area on a side surface of said body and configured to be in fluid communication with said substrate processing area; and a heating apparatus disposed so as to surround an external periphery of said reaction tube, said heating apparatus having a heat insulator that surrounds said body, an inlet opening that is formed in the shape of a groove in said heat insulator from a lower end of said heat insulator so as to avoid contact and interference with said gas inlet tube, and into which said gas inlet tube is inserted, and a heating element disposed between said heat insulator and said reaction tube.

2. The substrate processing apparatus according to claim 1, wherein said gas inlet tube is disposed at a position that faces all of said plurality of substrates in said substrate processing area.

3. The substrate processing apparatus according to claim 1, wherein said substrate processing area has a dummy substrate processing area that processes a plurality of dummy substrates and a substrate product processing area that processes a plurality of substrate products, and said gas inlet tube is disposed at a position facing said plurality of substrate products in said substrate product processing area.

4. The substrate processing apparatus according to claim 1, further comprising a second heat insulator separated from said heat insulator and disposed on a lower end side of said body away from an area in which said gas inlet tube is disposed, and a heater separated from said heating element and disposed between said second heat insulator and said reaction tube.

5. The substrate processing apparatus according to claim 1, wherein said gas inlet tube is disposed at a position that faces a part of said plurality of substrates in said substrate processing area.

6. A substrate processing apparatus comprising:

a reaction tube that processes a plurality of substrates inside said reaction tube, said reaction tube having a body that has a substrate processing area processing said plurality of substrates inside said reaction tube, and a gas inlet tube that is disposed at a position facing said plurality of substrates in said substrate processing area on a side surface of said body and configured to be in fluid communication with said substrate processing area; and a heating apparatus disposed so as to surround an external periphery of said reaction tube, said heating apparatus having a heat insulator that surrounds said body, an inlet opening that is formed in the shape of a groove in said heat insulator from a lower end of said heat insulator so as to avoid contact and interference with said gas inlet tube, and into which said gas inlet tube is inserted, a first heating element that is disposed between said heat insulator and said body, and a second heating element that is disposed between said inlet opening and said gas inlet tube.

7. The substrate processing apparatus according to claim 6, comprising a plurality of said second heating elements that are disposed in parallel from a gas upstream side of said gas inlet tube to a gas downstream side.

8. The substrate processing apparatus according to claim 6, wherein said reaction tube further comprises a gas exhaust tube that is disposed at a position facing said plurality of substrates in said substrate processing area on said side surface of said body, and said heating apparatus further comprises an output opening that is formed in the shape of a groove in said heat insulator from the lower end of said heat insulator so as to avoid contact and interference with said gas exhaust tube, and into which said gas exhaust tube is inserted, and a third heating element that is disposed between said output opening and said gas exhaust tube.

9. The substrate processing apparatus according to claim 6, wherein said second heating element has a greater heating speed in comparison with said first heating element.

10. The substrate processing apparatus according to claim 6, wherein said second heating element is a lamp heater; and said first heating element is a resistance heater.

11. The substrate processing apparatus according to claim 8, comprising a plurality of said third heating elements disposed in parallel from a gas upstream side of said gas exhaust tube to a gas downstream side.

12. A heating apparatus that is used in a semiconductor manufacturing apparatus, said apparatus including a reaction tube having a body with a substrate processing area processing a plurality of substrates inside said reaction tube, and a gas inlet tube disposed at a position facing said plurality of substrates in said substrate processing area on a side surface of said body and configured to be in fluid communication with said substrate processing area, the heating apparatus comprising:

a heat insulator that surrounds said body; and an inlet opening that is formed in the shape of a groove in said heat insulator from a lower end of said heat insulator so as to avoid contact and interference with said gas inlet tube, and into which said gas inlet tube is inserted.

* * * * *